United States Patent
Aoki et al.

(10) Patent No.: US 7,599,187 B2
(45) Date of Patent: Oct. 6, 2009

(54) SEMICONDUCTOR MODULE AND HEAT RADIATING PLATE

(75) Inventors: Shuzo Aoki, Nagano (JP); Hisateru Iijima, Nagano (JP); Katsuaki Sakai, Nagano (JP); Meisou Chin, Nagano (JP)

(73) Assignee: Shinko Electric Industries Co., Ltd., Tokyo (JP)

( * ) Notice: Subject to any disclaimer, the term of this patent is extended or adjusted under 35 U.S.C. 154(b) by 40 days.

(21) Appl. No.: 11/775,545

(22) Filed: Jul. 10, 2007

(65) Prior Publication Data

US 2008/0013286 A1    Jan. 17, 2008

(30) Foreign Application Priority Data

Jul. 13, 2006    (JP)    ............... 2006-192264

(51) Int. Cl.
*H05K 7/20*    (2006.01)
(52) U.S. Cl. ............ 361/719; 361/704; 361/715; 257/712; 257/718; 165/80.3
(58) Field of Classification Search .............. None
See application file for complete search history.

(56) References Cited

U.S. PATENT DOCUMENTS

| | | | | |
|---|---|---|---|---|
| 5,247,426 A | * | 9/1993 | Hamburgen et al. | 361/705 |
| 5,623,394 A | * | 4/1997 | Sherif et al. | 361/705 |
| 6,054,198 A | | 4/2000 | Bunyan et al. | |
| 6,212,074 B1 | * | 4/2001 | Gonsalves et al. | 361/717 |
| 6,396,700 B1 | * | 5/2002 | Chu et al. | 361/705 |
| 6,982,877 B2 | * | 1/2006 | Vinson et al. | 361/719 |
| 7,023,699 B2 | * | 4/2006 | Glovatsky et al. | 361/704 |
| 7,031,162 B2 | * | 4/2006 | Arvelo et al. | 361/718 |
| 7,193,318 B2 | * | 3/2007 | Colgan et al. | 257/713 |
| 7,221,569 B2 | * | 5/2007 | Tsai | 361/704 |
| 7,349,219 B2 | * | 3/2008 | Lai et al. | 361/719 |
| 7,365,985 B1 | * | 4/2008 | Ni | 361/715 |
| 7,375,964 B2 | * | 5/2008 | Lai et al. | 361/704 |
| 7,391,613 B2 | * | 6/2008 | Lai et al. | 361/700 |
| 7,400,506 B2 | * | 7/2008 | Hoss et al. | 361/715 |
| 2006/0067054 A1 | | 3/2006 | Wang et al. | |
| 2007/0206360 A1 | * | 9/2007 | Chu | 361/715 |

FOREIGN PATENT DOCUMENTS

| | | |
|---|---|---|
| JP | 11-163566 | 6/1999 |
| JP | 2001-196516 | 7/2001 |
| JP | 2002-134970 | 5/2002 |
| WO | WO 02/085339 | 10/2002 |

* cited by examiner

*Primary Examiner*—Boris L Chervinsky
(74) *Attorney, Agent, or Firm*—Rankin, Hill & Clark LLP

(57) ABSTRACT

A semiconductor module in which a plurality of kinds of semiconductor devices having different heat generating amounts in being operated are mixedly present, heat conducting sheets are interposed between a module main body mounted to a board and outer faces of the semiconductor devices, and heat radiating plates are mounted thereto by covering outer faces of the semiconductor devices over two pieces or more of the semiconductor devices, wherein the heat conducting sheet having a heat conductivity higher than a heat conductivity of the heat conducting sheet used for the semiconductor device having a heat generating amount smaller than a heat generating amount of the semiconductor device is used for the semiconductor device having a large heat generating amount in the semiconductor devices.

8 Claims, 6 Drawing Sheets

SEMICONDUCTOR MODULE AND HEAT RADIATING PLATE

This application claims priority to Japanese Patent Application No. 2006-192264, filed Jul. 13, 2006, in the Japanese Patent Office. The priority application is incorporated by reference in its entirety.

TECHNICAL FIELD

The present disclosure relates to a semiconductor module and a heat radiating plate, further in details relates to a semiconductor module promoting a property of radiating heat from a semiconductor device mounted to a board and a heat radiating plate used for the semiconductor module.

RELATED ART

There is generally carried out a method of radiating heat by attaching a heat radiating plate to a semiconductor device or interposing a resin having an excellent heat conductivity between a semiconductor device and a heat radiating plate in order to radiate heat from the semiconductor device mounted to aboard (refer to Japanese Patent Unexamined Publication No. 11-163566, and Japanese Patent Unexamined Publication No. 2002-134970).

FIGS. 6A, 6B, 6C shows a heat radiating structure of a related art for promoting a property of radiating heat of a semiconductor module mounted with memory elements (refer to Japanese Patent Unexamined Publication No. 2001-196516). FIGS. 6A, 6B, 6C area front view, a cross-sectional view, a vertical sectional view of a semiconductor module. The semiconductor module is constituted by mounting a plurality of pieces of memory elements 102 on both faces of a circuit board 100 and attaching heat radiating plates 104a, 104b to be brought into contact with the memory elements 102.

The heat radiating plates 104a, 104b are locked by a hinge 108 at end edges thereof on one side, mounted to interpose the circuit board 100 in a thickness direction and fixed by pinching opening/closing sides thereof by a clip 110. The memory elements 102 are brought into contact with inner side faces of the heat radiating plates 104a, 104b to radiate heat.

Although according to the semiconductor module shown in FIGS. 6A, 6B, 6C, heat is irradiated from the memory element 102 mounted to the circuit board 100, in a semiconductor module in recent times, there is a product mounted with a control element (semiconductor device) for control referred to as AMB (Advanced Memory Buffer) as a high speed memory module for being used in a server or the like. According to the semiconductor module mounted with the AMB, whereas heat generated from a memory element also poses a problem, heat generated from the AMB considerably exceeds that of the memory element, and therefore, it is requested to efficiently radiate heat from the AMB. When the AMB exceeds a rectified temperature, the AMB is not normally operated, a necessary characteristic is not achieved, and therefore, it is extremely important for the product to promote a property of radiating heat from the semiconductor module.

SUMMARY

Exemplary embodiments of the present invention provides a semiconductor module enabling to radiate heat efficiently in a semiconductor module mounted with semiconductor devices (elements) having different heat generating amounts in being operated and capable of easily mounting even a semiconductor device having a large heat generating amount and a heat radiating plate used therefor.

According to an aspect of one or more exemplary embodiments of the present invention, there is provided a semiconductor module characterized in a semiconductor module in which a plurality of kinds of semiconductor devices having different heat generating amounts in being operated are mixedly present, a heat conducting sheet is interposed between a module main body mounted to a board and an outer face of the semiconductor device, and a heat radiating plate is mounted to cover the outer faces of the semiconductor devices over two pieces or more of the semiconductor devices, wherein a heat conducting sheet having a heat conductivity higher than a heat conductivity of the heat conducting sheet used for the semiconductor device having a heat generating amount smaller than a heat generating amount of the semiconductor device is used for the semiconductor device having the large heat generating amount in the semiconductor devices.

Further, a mode of the semiconductor device mounted to the board is not particularly limited but a semiconductor device formed by sealing a semiconductor element by resin, a semiconductor device mounted with a semiconductor element by flip chip connection can be utilized.

Further, the heat radiating plate can be arranged to cover over a number of the semiconductor devices mounted to the board, or the heat radiating plate can also be formed by a planar shape covering a planar region of the board to mount to cover all of the semiconductor devices mounted on the board. By providing the heat radiating plate to cover a total of a plane of the board, the semiconductor module excellent in a heat radiating property can be constituted.

Further, by squeezing to hold the module main body and the heat radiating plate elastically in a thickness direction by a clip formed by folding to bend an elastic plate member by a "C"-like shape in a shape of a side face thereof, integration of the semiconductor module is facilitated, and a heat radiating property of the semiconductor module can be promoted.

Further, the present invention is particularly effective for a product in which the semiconductor devices mounted to the module main body are a memory element and a control element for a memory buffer having a heat generating amount in being operated larger than a heat generating amount in being operated of the memory element.

Further, the property of radiating heat from the control element can further be promoted by constituting an interval for separating the control element for the memory buffer and the heat radiating plate to be equal to or smaller than 0.05 mm.

Further, a heat radiating plate mounted to a module member mounted with the semiconductor devices having the different heat generating amounts in being operated and pasted with heat conducting sheets in accordance with positions of arranging the semiconductor devices, which is pasted with the heat conducting sheet having a heat conductivity higher than a heat conductivity of the heat conducting sheet used for the semiconductor device having the heat generating amount smaller than the heat generating amount of the semiconductor device for the semiconductor device having the large heat generating amount, achieves an effective heat radiating operation as the heat radiating plate for the semiconductor module.

Further, the heat radiating plate can effectively be used by being mounted to the module main body mounted with the memory element and the control element for the memory buffer as the semiconductor devices.

One or more exemplary embodiments of the present invention may include one or more the following advantages. For example, according to the semiconductor module and the heat radiating plate according to the present invention, heat can effectively be radiated from the semiconductor devices having the different heat generating amounts in being operated, to be able to provide the semiconductor module having a stable characteristic. Further, even the semiconductor device having the large heat generating amount can easily be mounted to the semiconductor module.

Other features and advantages may be apparent from the following detailed description, the accompanying drawings and the claims.

DETAILED DESCRIPTION

A preferable embodiment of the present invention will be explained in details in reference to the attached drawings as follows.

Figure 1A:
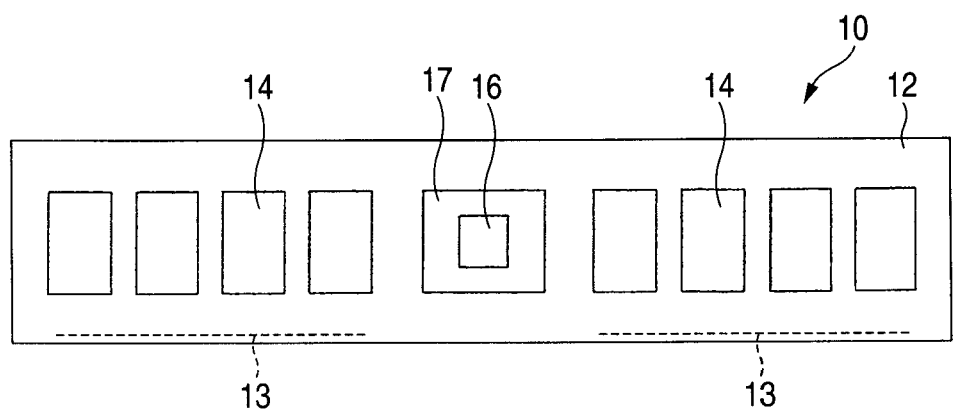
FIG. 1A illustrates a plane view of a module main body constituting a semiconductor module according to the present invention.
Figure 1B:
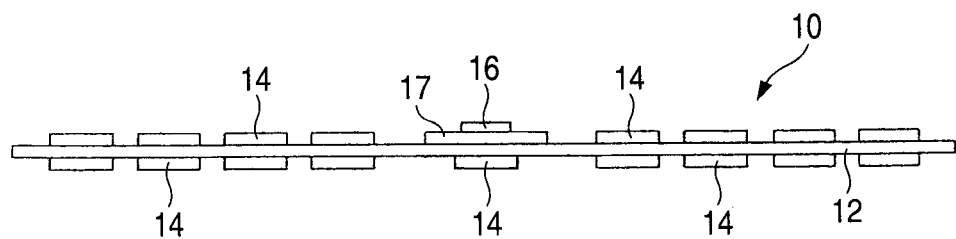
FIG. 1B illustrates a front view of a module main body constituting a semiconductor module according to the present invention.

FIGS. 1A and 1B are a plane view and a front view showing a constitution of an embodiment of a module main body 10 constituting a semiconductor module according to the present invention. The module main body 10 includes a board 12 formed in a rectangular shape, memory elements 14 mounted to both faces of the board 12, and a control element 16 mounted to a face on one side of the board 12. A connector 13 is provided at an end edge on one side along a longitudinal direction of the board 12.

The control element 16 of the semiconductor module of the exemplary embodiment is operated as a memory buffer (AMB). The control element 16 is mounted to a circuit board 17 and the circuit board 17 is bonded to the board 12. Therefore, the control element 16 is disposed at a position higher than that of the memory element 14 relative to a board face.

Further, FIG. 1A shows the most general constitution of a constitution of the semiconductor module having the memory buffer. Depending on products, two rows of the memory elements 14 are arranged in the longitudinal direction of the board 12.

Figure 2A:
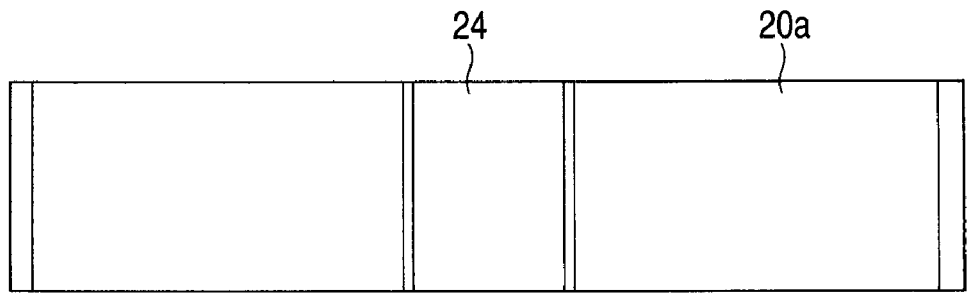
FIGS. 2A to 2D illustrate a plane view and a front view of a heat radiating plate.
Figure 2B:
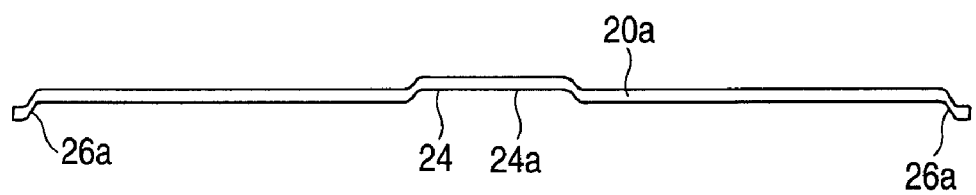
Figure 2C:
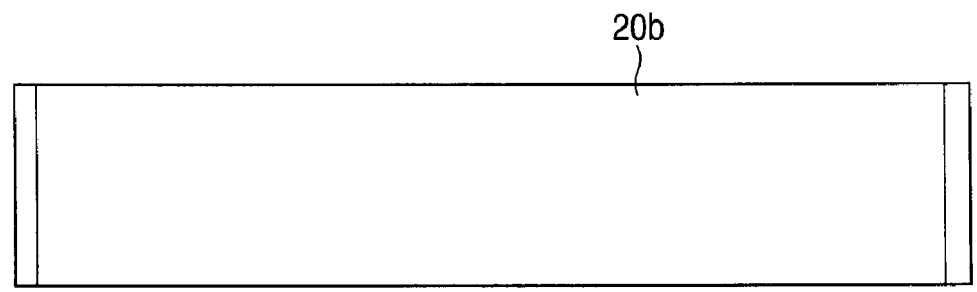
Figure 2D:

FIGS. 2A to 2D show a constitution of a heat radiating plate as a constituent part of the semiconductor module. FIGS. 2A and 2B are a plane view and a front view of a heat radiating plate 20a mounted to a face (face on one side) of the board 12 mounted with the control element 16. FIGS. 2C and 2D are a plane view and a front view of a heat radiating plate 20b mounted to a face on other side of the board 12.

The heat radiating plates 20a, 20b are formed by a rectangular shape of a size of covering a planar region of the board 12 in accordance with a planar shape of the board 12.

The heat radiating plate 20a mounted to the face on one side of the board 12 is formed with a containing recess portion 24 in accordance with a position of arranging the control element 16. As shown by FIG. 2B, the heat radiating plate 20a is projected to an outer side at a portion thereof formed with the containing recess portion 24 to form a stepped difference at an outer face of the heat radiating plate 20a. An inner face 24a of the containing recess portion 24 is formed by a flat face.

Further, both ends in the longitudinal direction of the heat radiating plates 20a, 20b are respectively formed with support projections 26a, 26b for supporting the heat radiating plates 20a, 20b to be floated up from board faces. The support projections 26a, 26b are provided over entire lengths in short side directions of the heat radiating plates 20a, 20b.

The heat radiating plates 20a, 20b may be provided with projections for positioning with the board 12 or may be provided with spacer projections for holding face intervals from the board 12. The projection for positioning can be formed by being positioned to a notch or a through hole formed at an end edge of the board 12.

The heat radiating plates 20a, 20b are formed by a pertinent material of copper, or aluminum so far as the material is a material excellent in a heat conductivity and a heat radiating property. According to the exemplary embodiment, the material is formed by an aluminum alloy (aluminum content 99.5%) having a thickness of 1 mm. The heat conductivity of the aluminum alloy is 230 (W/m·K). By subjecting an aluminum alloy to an alumite treatment, a high heat radiating property can be achieved and a sufficient strength can be achieved by resolving a problem of being easy to be impaired.

Figure 3:
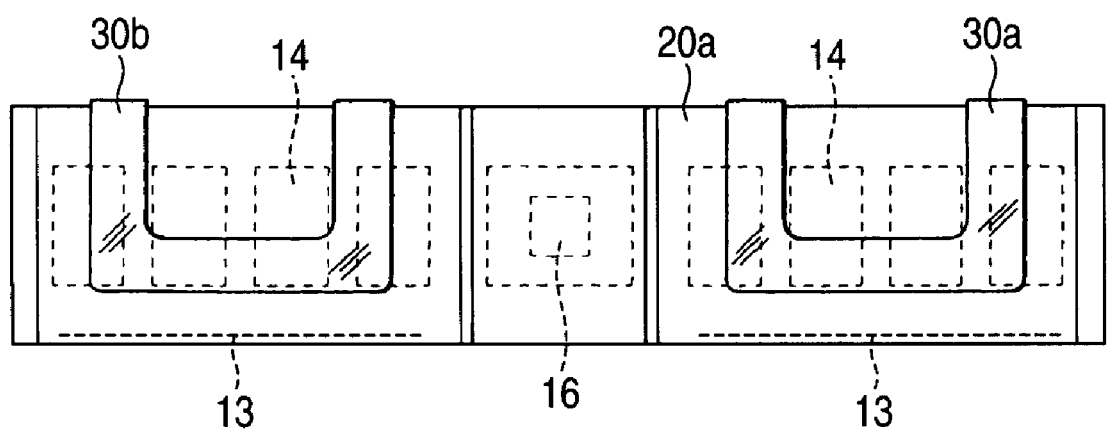
FIG. 3 is a plane view of a semiconductor module attaching a heat radiating plate to a module main body.

FIG. 3 shows a plane view in a state of mounting the heat radiating plates 20a, 20b to the module main body 10. The semiconductor module according to the exemplary embodiment is integrated by positioning the heat radiating plates 20a, 20b to both faces of the module main body 10 and elastically squeezing the heat radiating plates 20a, 20b from both sides by clips 30a, 30b. The clips 30a, 30b are formed by folding to bend elastic plates in a "C"-like shape in shapes of side faces thereof. By bringing the heat radiating plates 20a, 20b into contact with the both faces of the module main body 10 and interposing the heat radiating plates 20a, 20b and the module main body 10 between hold pieces of the clips 30a, 30b, the heat radiating plates 20a, 20b and the module main body 10 are integrally supported by a predetermined squeezing force.

According to the semiconductor module of the exemplary embodiment, when the module main body 10 is interposed by the heat radiating plates 20a, 20b, the semiconductor module is assembled by interposing sheets (heat conducting sheets) having an excellent heat conductivity between the module main body 10 and the heat radiating plates 20a, 20b.

Figure 4A:
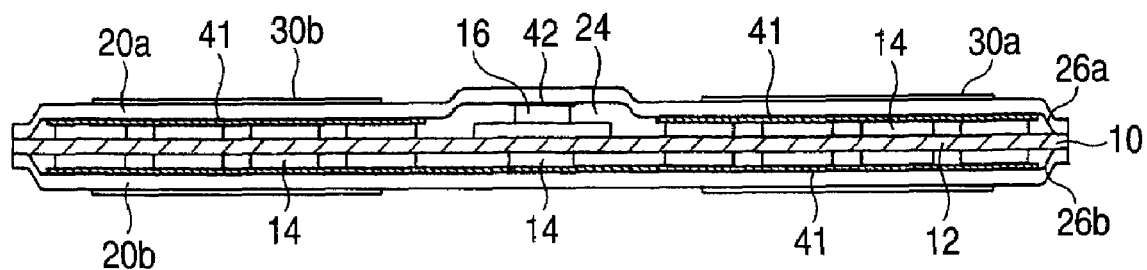
FIGS. 4A, 4B illustrate front views of the semiconductor module attaching the heat radiating plate to the module main body.
Figure 4B:
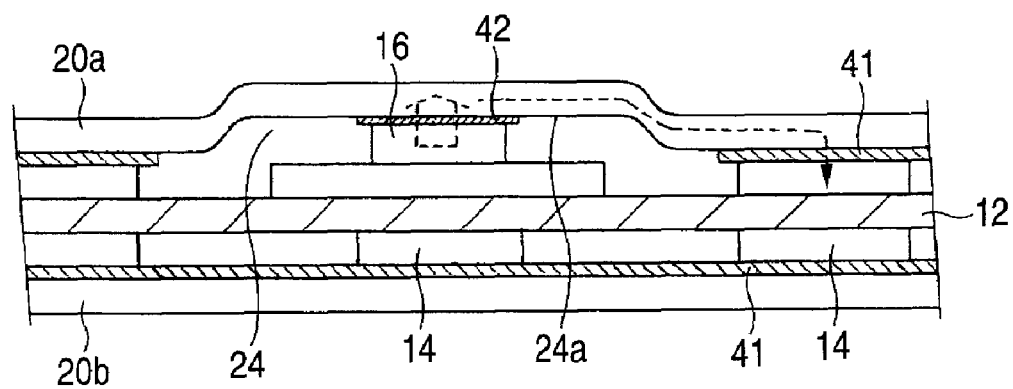

FIGS. 4A, 4B show a state of viewing a state of integrating the semiconductor module by interposing a first heat conducting sheet 41 and a second heat conducting sheet 42 between the module main body 10 and the heat radiating plates 20a, 20b from a front direction. The first heat conducting sheets 41 are interposed between the memory elements 14 and the heat radiating plates 20a, 20b, the second heat conducting sheet 42 is interposed between the control element 16 and the heat radiating plate 20a, and the module main body 10 is squeezed by the heat radiating plates 20a, 20b by the clips 30a, 30b.

As shown by FIG. 4B, the control element 16 is contained at inside of the containing recess portion 24 provided at the heat radiating plate 20a, and a back face of the control element 16 is brought into contact with the inner face 24a of the containing recess portion 24 by way of the second heat conducting sheet 42. The memory elements 14 are brought into contact with the first heat conducting sheets 41 at outer faces (outer faces of resin seal portion) thereof and brought into contact with the inner faces of the heat radiating plates 20a, 20b by way of the first heat conducting sheets 41.

According to the semiconductor module of the exemplary embodiment, there is constituted a mode of covering the heat radiating plates 20a, 20b formed in a flat plate shape on the both faces of the module main body 10, and therefore, there is constituted a mode of penetrating a space portion in a width direction of the semiconductor module in the width direction. That is, the semiconductor module is constituted by a mode of making an air flow flow in the width direction to thereby promote the heat radiating property.

Although both of the first heat conducting sheet 41 and the second heat conducting sheet 42 are interposed between the memory elements 14 and the control element 16 to improve heat conduction from the memory elements 14 and the control element 16 to the heat radiating plates 20a, 20b, the semiconductor module of the exemplary embodiment is characterized in using two kinds of heat conducting sheets having different heat conductivities as the first heat conducting sheet 41 and the second heat conducting sheet 42 and using a heat conducting material having a heat conductivity more excellent than that of the first heat conducting sheet 41 for the second heat conducting sheet 42.

Figure 5A:
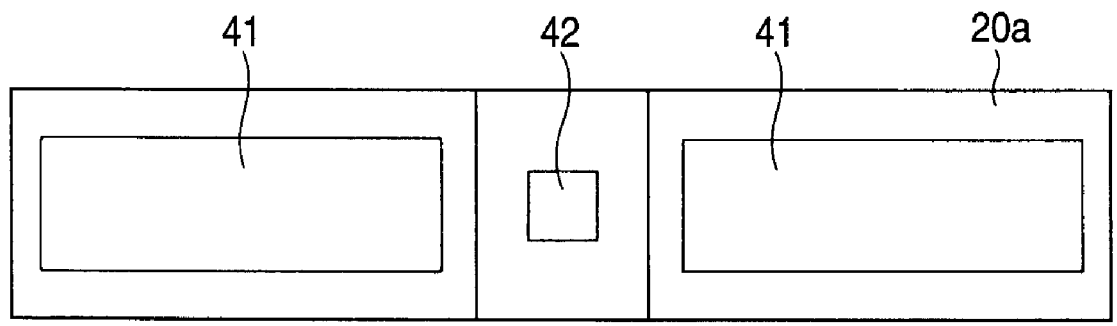
FIGS. 5A, 5B are plane views of the heat radiating plate in a state of being pasted with a heat conducting sheet.
Figure 5B:
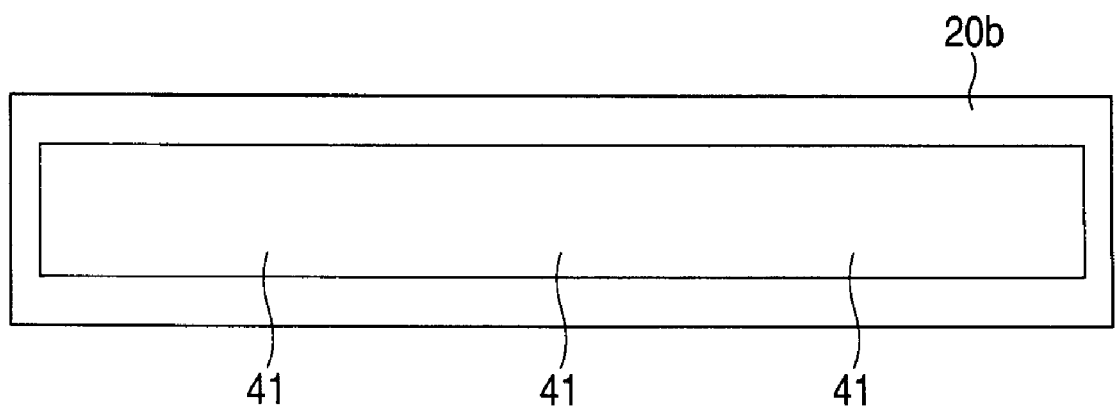
Figure 6A:
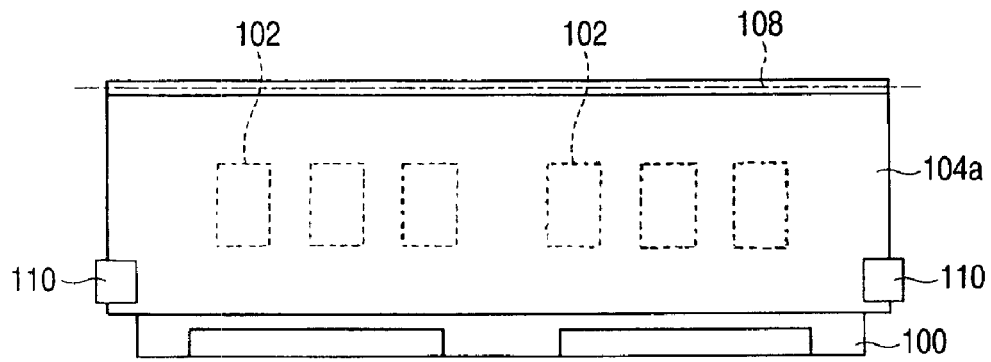
FIGS. 6A to 6C illustrate a plane view and sectional views showing a constitution of a semiconductor module mounted with a heat radiating plate of a related art.
Figure 6B:
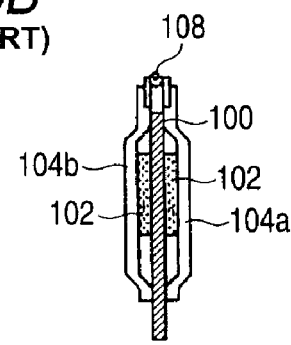
Figure 6C:
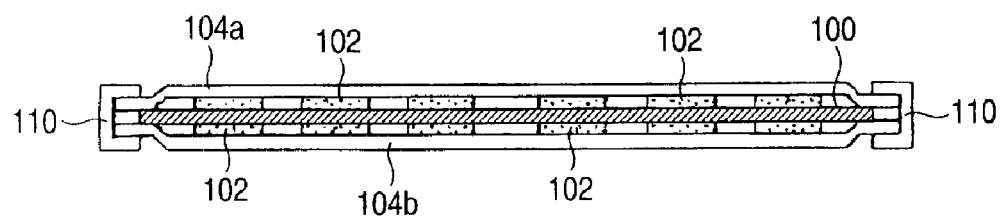

FIGS. 5A, 5B illustrate plane views in a state of pasting the first heat conducting sheet 41 and the second heat conducting sheet 42 to the inner faces of the heat radiating plates 20a, 20b. The heat radiating plate 20a on one side attached to the board face mounted with the control element 16 is pasted with the second heat conducting sheet 42 in accordance with a position of arranging the control element 16, and pasted with the first heat conducting sheet 41 in accordance with a position of arranging the memory element 14. The heat radiating plate 20b on other side is pasted with the first heat conducting sheet 41 in accordance with a position of being mounted with the memory element 14.

By pasting the first heat conducting sheet 41 and the second heat conducting sheet 42 to the heat radiating plates 20a, 20b in this way, the first heat conducting sheet 41 and the second heat conducting sheet 42 are interposed between the module main body 10 and the heat radiating plates 20a, 20b to be integrated thereby by positioning and clamping the heat radiating plates 20a, 20b to the module main body 10.

Height dimensions of the support projections 26a, 26b provided at the heat radiating plates 20a, 20b and height dimensions of the stepped difference of the containing recess portion 24 are set such that when the heat radiating plates 20a, 20b are attached to the board 12, the memory element 14 and the control element 16 are brought into contact therewith by way of the first heat conducting sheet 41 and the second heat conducting sheet 42. Further, the stepped difference of the containing recess portion 24 are set to be smaller than the difference between the heights of the control element 16 and the memory element 14.

According to the exemplary embodiment, two kinds of the heat conducting sheets having different heat conductivities are used for promoting a property of radiating heat from the control element 16 by efficiently conducting heat from the control element 16 having the heat generating amount in being operated larger than that of the memory element 14 to the heat radiating plate 20a and for preventing the heat radiated from the control element 16 from flowing back to a side of the memory element 14.

Generally, when a heat radiating plate is brought into contact with a heat generating member by way of a heat conducting sheet to radiate heat from the heat generating member, it is efficient to use a heat conducting material having a heat conductivity as high as possible as the heat conducting sheet. Therefore, also according to the exemplary embodiment, it seems to be efficient to use the heat conducting sheets having the heat conductivities as high as possible as the first heat conducting sheet 41 and the second heat conducting sheet 42. However, when semiconductor devices (elements) having different heat generating amounts are mounted and heat radiating plates are commonly attached thereto as in the semiconductor module according to the exemplary embodiment, it is actually effective to interpose a heat conducting sheet having a high heat conductivity to a semiconductor device (element) having a large heat generating while being operated and to interpose a heat conducting sheet a heat conductivity of which is inferior thereto to a semiconductor device (element) having a small heat generating amount.

According to the exemplary embodiment, as the first heat conducting sheet 41, a heat conducting sheet having a heat conductivity of about 2.0 (W/m·K) is used, and as the second heat conducting sheet 42, a heat conducting sheet having a heat conductivity of about 3.0 (W/m·K) is used.

When an operating temperature of the control element 16 is measured for a case of using heat conducting sheets having different heat conductivities as the first heat conducting sheet 41 and the second heat conducting sheet 42 of the exemplary embodiment and a comparative example of using high heat conducting sheets (heat conducting sheets having heat conductivities of about 3.0 (W/m·K)) for both of the first heat conducting sheet 41 and the second heat conducting sheet 42, in the case of the exemplary embodiment, in comparison with the comparative example, a temperature rise of the control element 16 can be reduced by 33%.

The fact shows that it is effective to use the heat conducting sheets having different heat conductivities as the first heat conducting sheet 41 and the second heat conducting sheet 42 and using the heat conducting sheet having the high heat conductivity for the control element 16 having the large heat generating amount.

Further, when it is measured how the operating temperature of the control element 16 is changed by a case of constituting material thicknesses of the clips 30a, 30b by 0.5 mm and a case of constituting the material thicknesses of the clips 30a, 30b by 0.6 mm in order to confirm operation by the clips 30a, 30b, when the material thicknesses of the clips 30a, 30b are constituted by 0.6 mm, the operating temperature of the control element 16 is reduced by 12%.

The fact shows that squeezing the heat radiating plates 20a, 20b by constant pressure significantly contributes to a reduction in the operating temperature of the control element 16. Therefore, in designating the clips 30a, 30b, it is effective to select a squeezing position, a squeezing area by the clips 30a, 30b, and material thicknesses, materials of the clips 30a, 30b.

Further, it is effective for conducting heat of the control element 16 to the heat radiating plate 20a such that the thickness of the heat conducting sheet 42 interposed between the heat radiating plate 20a and the control element 16 is as thin as possible. Although sheets having various thicknesses can be utilized as the heat conducting sheet 42, it is preferable to design the stepped difference of the containing recess portion 24 such that the interval between the back face of the control element 16 and the inner face 24a of the containing recess portion 24 is made to be as narrow as possible. The interval between the back face of the control element 16 and the inner face 24a of the containing recess portion 24 may be about 0.05 mm.

Further, although according to the exemplary embodiment, an explanation has been given of the semiconductor module mounted with the memory element 14 and the control element 16 used as AMB, the present invention is not limited to the constitution of the exemplary embodiment but applicable similarly to a semiconductor module mounted with semiconductor devices (elements) having different heat generating amounts. Also in this case, a heat radiating plate may be mounted to a semiconductor device (element) having a large heat generating amount and a semiconductor device (element) having a small heat generating amount by respectively interposing heat conducting sheets having large and small heat conductivities.

Further, although according to the exemplary embodiment, an explanation has been given of the semiconductor module provided with the heat conducting sheets having different heat conductivities, the present invention is not limited to the constitution of the exemplary embodiment but applicable similarly to a semiconductor module provided with a phase change tape used for a semiconductor device having a large heat generating amount and a non-phase change tap used for a semiconductor device having a heat generating amount smaller than the large heat generating amount of the semiconductor device. The semiconductor module with such a constitution can have the same effect as that of the exemplary embodiment.

Also in this case, a heat radiating plate may be mounted to a semiconductor device (element) having a large heat generating amount and a semiconductor device (element) having a small heat generating amount by respectively interposing heat conducting sheets having large and small heat conductivities.

While the present invention has been described with respect to a limited number of embodiments, those skilled in the art, having benefit of this disclosure, will appreciate that other embodiments can be devised which do not depart from the scope of the present invention as disclosed herein. Accordingly, the scope of the present invention should be limited only by the attached claims.

Also in this case, a heat radiating plate may be mounted to a semiconductor device (element) having a large heat generating amount and a semiconductor device (element) having a small heat generating amount by respectively interposing heat conducting sheets having large and small heat conductivities.

While the present invention has been described with respect to a limited number of embodiments, those skilled in the art, having benefit of this disclosure, will appreciate that other embodiments can be devised which do not depart from the scope of the present invention as disclosed herein. Accordingly, the scope of the present invention should be limited only by the attached claims.

What is claimed is:

1. A semiconductor module comprising:
    a module main body having a board and at least two kinds of semiconductor devices mounted on the board, wherein, a first kind of semiconductor device generates a relatively larger amount of heat than does a second kind of semiconductor device while being operated;
    first and second heat radiating plates mounted to cover outer faces of the semiconductor devices; and
    a plurality of heat conducting sheets interposed between the module main body and each of the heat radiating plates, the plurality of heat conducting sheets including at least first and second heat conducting sheets,
    wherein the first heat conducting sheet is interposed between the first kind of semiconductor device and the first heat radiating plate and has a relatively higher heat conductivity than the second heat conducting sheet, and the second heat conducting sheet is interposed between the second kind of semiconductor device and the first heat radiating plate and has a relatively lower heat conductivity than the first heat conducting sheet,
    wherein the plurality of the second kind of semiconductor devices are provided on the board, and the second heat conducting sheet is provided so as to cover at least two of the second kind of semiconductor devices, and
    wherein the second heat radiating plate is formed in a planar shape so as to cover a planar region of the board and is mounted to cover all of the semiconductor devices mounted on one side the board.

2. The semiconductor module according to claim 1, further comprising:
    a C-shaped clip formed by folding an elastic plate member into a "C"-like shape,
    wherein the module main body and the heat radiating plates are held by being elastically squeezed in a thickness direction by the clip.

3. The semiconductor module according to claim 1, wherein the first kind of semiconductor device mounted to the module main body is a control element for a memory buffer, and the second kind of semiconductor device is a memory element, wherein the first kind of semiconductor device generates a greater amount of heat while being operated than the second kind of semiconductor device, and
    wherein the first heat radiating plate has an elevated region in a position corresponding to the position of the first kind of semiconductor device.

4. The semiconductor module according to claim 3, wherein a separation between the control element for the memory buffer and the heat radiating plate is equal to or smaller than 0.05 mm.

5. A heat radiating plate for a semiconductor module having a module main body mounted with a plurality of semiconductor devices, wherein the plurality of semiconductor devices include first and second kinds of semiconductor devices, wherein the first kind of semiconductor device generates a different amount of heat than does the second kind of semiconductor device while being operated, the heat radiating plate comprising:
    a planar body with a one surface facing the module main body and an opposite surface facing away from the module main body, and
    first and second heat conducting sheets that are pasted on the one surface of the planar body of the heat radiating plate, wherein said first heat conducting sheet has a different heat conductivity than does said second heat conducting sheet.

6. The heat radiating plate for a semiconductor module according to claim 5, wherein the first heat conducting sheet has a relatively higher heat conductivity and the second heat conducting sheet has a relatively lower heat conductivity,
    wherein, the first heat conducting sheet is pasted on the one surface of the heat radiating plate in a position corresponding to that of the first kind of semiconductor device, which generates a relatively greater amount of heat, and the second heat conducting sheet is pasted on the one surface of the heat radiating plate in a position corresponding to the second semiconductor device, which generates a relatively lower amount of heat than the first semiconductor device.

7. The heat radiating plate for a semiconductor module according to claim 5, wherein the first kind of semiconductor device has a control element for a memory buffer and is mounted in a generally central location on the module main body, and the heat radiating plate has an elevated portion corresponding to the position of the control element for the memory buffer.

8. A semiconductor module comprising:
- a module main body having a board and first and second kinds of semiconductor devices mounted on the board, wherein the first kind of semiconductor device generates a greater amount of heat than does the second kind of semiconductor device while being operated;
- first and second heat radiating plates mounted to cover outer faces of the semiconductor devices;
- a phase change tape interposed between the first heat radiating plate and the first kind of semiconductor device, wherein the first heat radiating plate is relatively elevated in a position corresponding to the first kind of semiconductor device; and
- a non-phase change tape interposed between the first heat radiating plate and the second kind of semiconductor device.

* * * * *